United States Patent [19]
Krishna

[11] Patent Number: 4,639,274
[45] Date of Patent: Jan. 27, 1987

[54] METHOD OF MAKING PRECISION HIGH-VALUE MOS CAPACITORS

[75] Inventor: Surinder Krishna, Fremont, Calif.

[73] Assignee: Fairchild Semiconductor Corporation, Cupertino, Calif.

[21] Appl. No.: 676,033

[22] Filed: Nov. 28, 1984

[51] Int. Cl.$^4$ .................... H01L 21/22; H01L 21/265
[52] U.S. Cl. ........................ 148/1.5; 29/571; 29/576 B; 29/577 C; 148/175; 148/187; 357/91
[58] Field of Search ............... 148/1.5, 187, 175; 29/576 B, 571, 577 C; 357/91

[56] References Cited

U.S. PATENT DOCUMENTS

| | | | |
|---|---|---|---|
| 4,208,670 | 6/1980 | Hoffmann et al. | 29/571 |
| 4,212,684 | 7/1980 | Brower | 148/1.5 |
| 4,240,195 | 12/1980 | Clemens et al. | 29/571 |
| 4,249,194 | 2/1981 | Rogers | 29/577 C |
| 4,373,250 | 2/1983 | Malwah | 29/571 |
| 4,391,032 | 7/1983 | Schulte | 29/571 |
| 4,459,740 | 7/1984 | Schwabe et al. | 29/576 B |
| 4,466,177 | 8/1984 | Chao | 29/577 C |

*Primary Examiner*—Upendra Roy
*Attorney, Agent, or Firm*—Carl L. Silverman; Stephen J. Phillips; Robert C. Colwell

[57] ABSTRACT

A method for producing an improved capacitor in MOS technology utilizing a thin layer oxide dielectric to improve the active/parasitic capacitance ratio while maintaining a high breakdown voltage and a low leakage current.

A polycrystalline silicon layer is formed over a silicon dioxide field region on a wafer of semiconductor silicon. Phosphorus ions are implanted in the polycrystalline silicon layer at an implant energy between approximately 80 and 100 keV. The surface of the polycrystalline silicon layer is oxidized to form an interpoly oxide, utilizing an oxidation temperature which, for the implant dosage of phosphorus ions used, is sufficient to make the interpoly oxide layer approximately 770 Angstroms thick. The structure is then annealed at a temperature of approximately 1100° C. in oxygen and HCl. A second polycrystalline silicon layer is formed over the interpoly oxide layer, and the process completed in the conventional manner.

9 Claims, 4 Drawing Figures

U.S. Patent  Jan. 27, 1987  Sheet 1 of 2  4,639,274
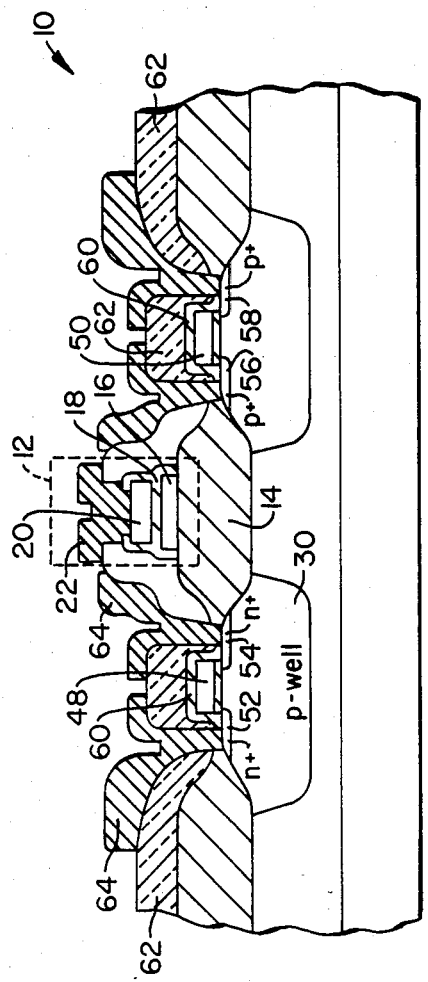
FIG._1.
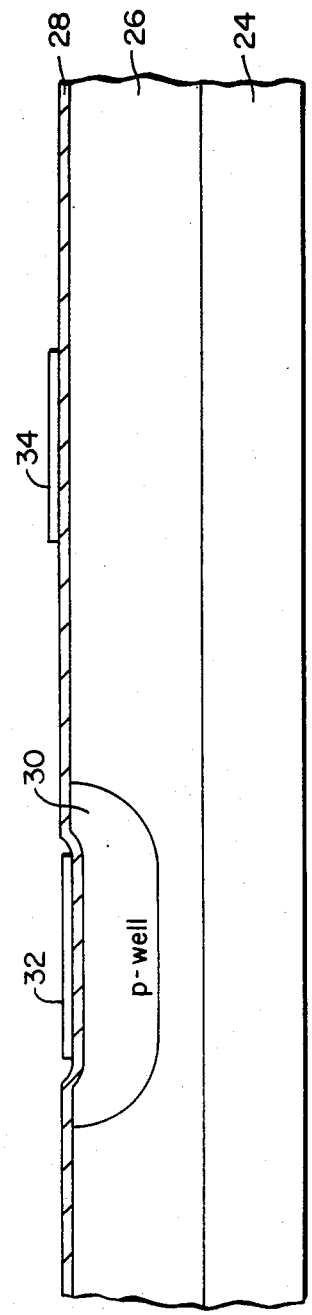
FIG._2.

METHOD OF MAKING PRECISION HIGH-VALUE MOS CAPACITORS

BACKGROUND OF THE INVENTION

1. Field of the Invention

This invention relates to a method of forming capacitors in integrated circuits, and more particularly in integrated circuits using CMOS (complementary metal oxide silicon) technology.

2. Description of the Prior Art

A capacitor is a device used to store electrical charge and is usually constructed from two conducting layers separated by an insulating dielectric layer. The amount of charge that a capacitor can store increases with the surface area of the capacitor and also increases as the dielectric layer is made thinner. However, a thinner dielectric layer will result in a lower maximum voltage for the capacitor and thus a lower breakdown voltage. The breakdown voltage is the voltage at which the capacitor can no longer store additional charge, and current passes through the capacitor. Additionally, as the dielectric layer is made thinner the leakage of current through the capacitor increases. Leakage current is undesirable because it drains the stored charge from the capacitor.

Capacitors formed in MOS (metal oxide silicon) integrated circuits are most commonly made by sandwiching a layer of an oxide of the semiconductor material (usually silicon dioxide) between two silicon layers or between a layer of silicon and a layer of metal. In MOS technology, unintentional (or parasitic) capacitance arises due to the placement and construction of transistors and isolating regions on a chip. Wherever a silicon dioxide layer exists between two layers of silicon or between a layer of silicon a layer of metal, parasitic capacitance will arise. Parasitic capacitance can thus arise between transistors or between elements of a transistor.

Intentionally produced capacitors (sometimes referred to as "active" capacitors) are usually formed over a field oxide layer to isolate the capacitor from other circuit elements. Silicon dioxide field regions are used in many types of MOS integrated circuits to provide electrical isolation. If the thickness of the field oxide is comparable to the thickness of the oxide layer used as a dielectric in the capacitor, the ratio of the value of active capacitance to the value of parasitic capacitance will be very poor. Reducing the thickness of the oxide layer in the capacitor, however, will lower the breakdown voltage and increase the leakage current. Thus, it is desirable to keep the dielectric layer thin to increase the ratio of active to parasitic capacitance, but it is desirable to keep the layer thick to provide for a high breakdown voltage and a low leakage current.

Polycrystalline silicon (commonly "polysilicon") is often used for capacitors in MOS and CMOS technologies. The silicon dioxide dielectric layer formed on the polysilicon is usually at least 1000 Angstroms thick. Thinner layers are not often used because of the difficulty in obtaining a uniform layer and problems with breakdown voltage and leakage current.

One technique used to improve the active/parasitic capacitance ratio is to deposit silicon nitride in the oxide layer through chemical vapor deposition. The use of nitride improves the dielectric characteristics of the capacitance, i.e., its resistance to breakdown and leakage. Such nitride deposition is difficult, however, because uniform deposits of the nitride are not obtained, thereby causing non-uniform characteristics throughout the capacitor.

SUMMARY OF THE INVENTION

The present invention provides a method for producing an improved capacitor in CMOS technology utilizing a thin layer silicon dioxide dielectric to improve the active/parasitic capacitance ratio while maintaining a high breakdown voltage and a low leakage current.

In a preferred embodiment, a polysilicon layer is formed over a field oxide layer on a wafer of semiconductor silicon. N-conductivity type ions, preferably phosphorus or arsenic, are implanted in the polysilicon layer at an implant energy between approximately 80 and 100 kilo electron volts. The surface of the polysilicon layer is then oxidized to form an interpoly silicon dioxide layer. The implant dosage of the earlier phosphorous implantation and the oxidation temperature are chosen to make the interpoly oxide layer between approximately 770 and 2000 Angstroms thick. Following oxidation, the structure is annealed at a high temperature, approximately 1100° C., in a mixture of oxygen and HCl. Then a second polysilicon layer is formed over the interpoly oxide layer. Thereafter, the process is completed in the usual manner, including the forming of metal contacts.

The implanting of phosphorus in the first polysilicon layer helps provide the desired dielectric characteristics. By using a reduced energy to implant the phosphorus, the peak concentration of phosphorus is closer to the surface of the polysilicon layer, thereby enhancing the oxidation process. The implanting, or doping, with phosphorus is done using a conventional liquid ($POCl_3$) or gaseous ($PH_3$) source. The use of an implant process ensures uniformity of the phosphorus deposits. The implant dosage controls the thickness of the following oxide layer in large steps. The implant energy used allows the fine tuning of the thickness to within less than approximately 50 Angstroms of the desired thickness.

The above process provides a very uniform thickness of oxide film across the silicon wafer within a single run and from one run to the next. The process also results in a high capacitance value, with low leakage current and a high breakdown voltage.

BRIEF DESCRIPTION OF THE DRAWINGS

FIG. 1 is a cross-sectional view of the preferred embodiment of the present invention.

FIGS. 2 through 4 depict intermediate structures illustrating processing steps utilized to form the preferred embodiment depicted in FIG. 1.

DETAILED DESCRIPTION OF THE PREFERRED EMBODIMENT

Figure 3:
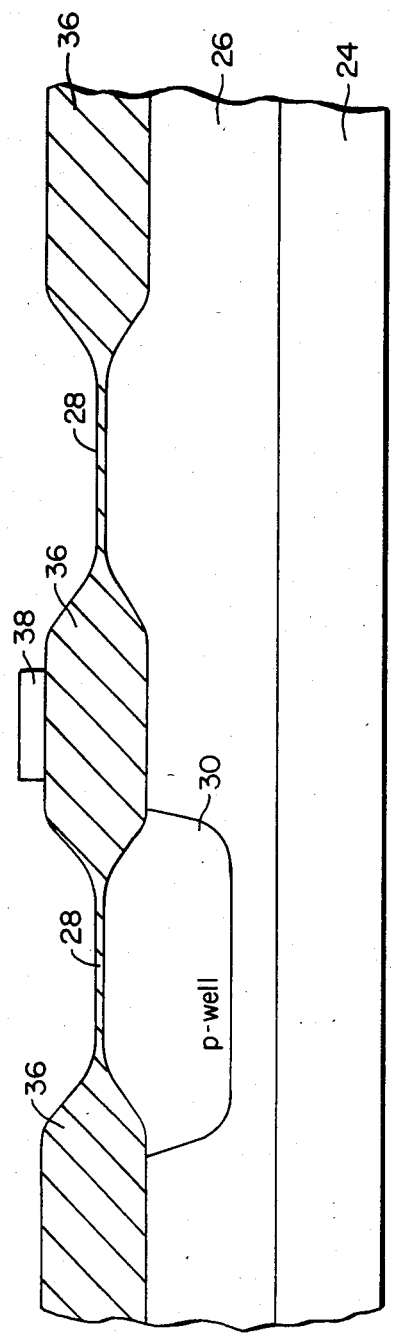

The following discussion first describes only the process steps necessary to form the improved capacitor of the present invention. Thereafter, the discussion will set forth how such process steps fit within conventional processing of a CMOS integrated circuit.

FIG. 1 shows a cross-sectional view of a completed CMOS circuit on a wafer 10. The capacitor of the present invention is located within dashed lines 12. Capacitor 12 is situated on top of a layer of field oxide 14. A polysilicon layer 16 is deposited on field oxide layer 14 utilizing a low pressure chemical vapor deposition process. The use of a low temperature (600° C.) results in elimination of asperities in the polysilicon layer. Preferably, the deposited polysilicon layer is approximately 4750 Angstroms thick. Phosphorus is then implanted into polysilicon layer 16 utilizing either a conventional liquid ($POCl_3$) or gaseous ($PH_3$) source. The implanting of phosphorus in polysilicon layer 16 is preferably done with an implant dosage of approximately $8 \times 10^{15}$ ions/cm$^2$. The implant energy is preferably 80 to 100 keV (kilo electron volts). The lower energy results in the peak concentration of phosphorus being closer to the surface and thereby enhancing the subsequent oxidation. Although phosphorus is preferred, alternately arsenic could be used. A conventional masking process is then used to etch away the polysilicon layer everywhere except where it is desired to form such capacitors.

Silicon dioxide layer 18 is then formed. The implant dosage of the earlier implanted phosphorus ions and the temperature of the oxidation are chosen to make layer 18 approximately 770 Angstroms thick. The oxidation process also preferably includes an annealing step utilizing a mixture of oxygen and hydrochloric acid (HCl) at approximately 1100° C. The preferred oxidation process is described in more detail below.

The second polysilicon layer 20 is then deposited on oxide layer 18 utilizing LPCVD (low pressure chemical vapor deposition) to produce polysilicon layer 20 which is approximately 4750 Angstroms thick. The processing of the circuit then continues through formation of metal connections in a conventional manner to provide a metal contact 22 to capacitor 12.

The oxidation process is preferably a dry oxidation process done according to the following cycle. A diffusion oven is set at a temperature of 850° C. ±1° C. with nitrogen and oxygen ($N_2 + O_2$) injected at a flow rate of 300 SCCM (standard cubic centimeters per minute). The boat containing the wafer is then pushed into the diffusion oven, and the oven is ramped up to 1000° C. at a rate of 8° C. per minute. Dry oxidation is then done by injecting oxygen ($O_2$) at a high flow rate (3000 SCCM) for 20 minutes. A mixture of 3% HCl and 97% oxygen is then injected at the same flow rate for an additional period of 21 minutes ±2 minutes. The $O_2$ is then replaced with $N_2$ (flow rate of 5550 SCCM) and the diffusion oven is ramped up to 1100° C. over a period of 20 minutes.

Annealing is then done in a mixture of 95.4% $N_2$, 3.4% $O_2$ and 1.2% HCl for a period of 60 minutes. The above mixture is then again replaced with $N_2$ (5550 SCCM) and the diffusion oven ramped down to a temperature of 850° C. over a period of 60 minutes. The boat containing the wafer is then removed from the diffusion oven. This oxidation process, combined with earlier phosphorous implantation at an implant energy of approximately 100 keV and an implant dosage of approximately $3 \times 10^{15}$ ions/cm$^2$, yields an oxide layer approximately 770 Angstroms thick.

The entire CMOS process into which the above process for making a capacitor is incorporated is described below. FIG. 2 shows an N-type silicon wafer 24 having crystal orientation of preferably <100> and resistivity of 0.02 ohm-cm. An epitaxial layer 26, preferably of 3 ohm-cm resistivity, is formed upon N-type silicon 24. Epitaxial layer 26 is then oxidized to produce a silicon dioxide layer 28 approximately 6500 Angstroms thick, and a mask used to allow removal of the oxide where a desired p-well 30 is to be implanted. The p-well is implanted utilizing boron with an implant energy of 60 keV and an implant dosage of $7.5 \times 10^{12}$ ions/cm$^2$. The wafer is then heated to further diffuse the boron. The depth of the p-well preferably will be approximately 6 microns.

Silicon nitride ($Si_3N_4$) is then deposited utilizing LPCVD to produce a nitride layer approximately 1200 Angstroms thick. A device well mask is then used in a conventional photolithographic and etching process to remove the nitride everywhere except from regions 32 and 34, where the npn and the pnp transistors, respectively, will be located.

A field implant mask is then applied to wafer 10 and the field implanted and oxidized to produce a thick silicon dioxide field region 36 as shown in FIG. 3. The original oxide layer 28, protected by nitride 32 and 34, remains after the field implantation and oxidation. The preferred depth of the field oxide layer is approximately 1.4 microns. Nitride layers 32 and 34 of FIG. 2 are then stripped from the wafer, and a pre-gate oxide layer approximately 6500 Angstroms thick created.

Next, a first polysilicon layer 38 approximately 4750 Angstroms thick is deposited utilizing LPCVD. Layer 38 is then implanted with phosphorus and masked. Using conventional etching processes, layer 38 is removed everywhere except where the desired capacitors are to be placed (only one such capacitor is shown in FIGS. 1–4). Layer 38 in FIG. 3 forms one plate of the capacitor, corresponding to layer 16 of FIG. 1 as discussed above. Oxide layer 28 is then etched from the gate area of the two transistors.

Figure 4:
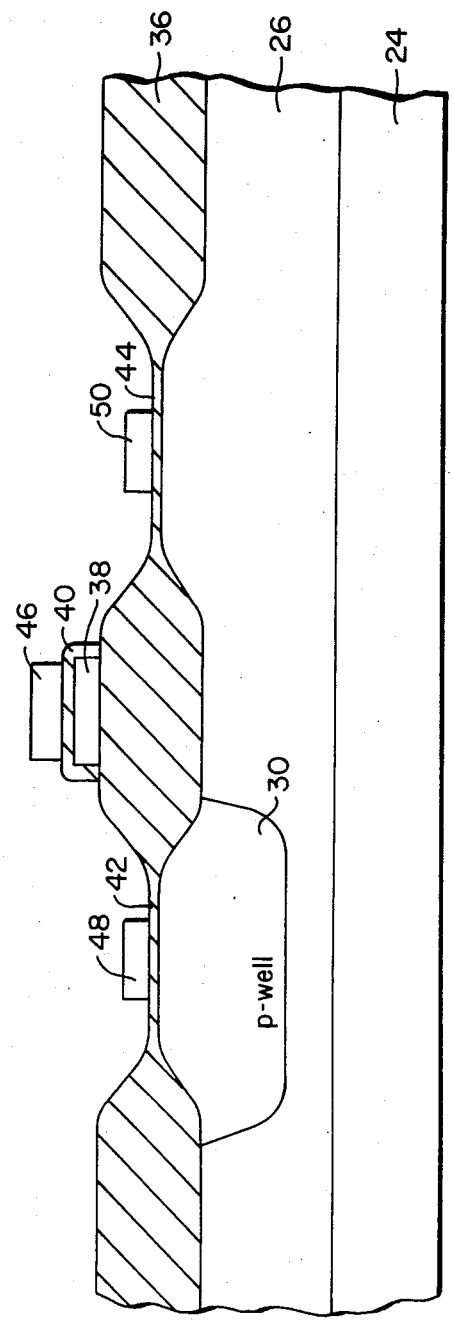

As shown in FIG. 4, another layer of silicon dioxide 40, 42, 44, approximately 770 Angstroms thick, is created in accordance with the oxidation process discussed above to provide interpoly oxide layer 40 and gate oxide layers 42 and 44. The threshold voltage of the transistors are then adjusted by boron implantation at a dose of $1.2 \times 10^{11}$ ions/cm$^2$ and an energy of 40 keV. This implantation is limited to the transistor areas.

A second polysilicon layer 46 is then deposited using an LPCVD process. The second polysilicon layer is implanted with phosphorus, using $POCl_3$, masked and etched to produce a polysilicon region 46, approximately 4750 Angstroms thick. Region 46 corresponds to layer 20 shown in FIG. 1. The etching also defines polysilicon regions 48 and 50 which will function as gates for the two complementary transistors.

Once capacitor 12 is completed, the wafer is then conventionally processed to produce the final circuit shown in FIG. 1, including metal interconnections. As shown in FIG. 1, this process results in an n-channel source 52, n-channel drain 54, p-channel source 56, p-channel drain 58, a second oxide layer 60, a PVX layer 62, and metal contacts 64 and 22.

The above process has resulted in capacitors having a maximum electric field strength of approximately $7.5 \times 10^6$ V/cm for the interpoly oxide which is comparable to field strengths obtained with oxides grown on single crystal silicon. This compares to values of approximately $5 \times 10^6$ V/cm found in polysilicon capacitors utilizing conventional techniques.

As will be understood by those familiar with the art, the present invention may be embodied in other specific forms without departing from the spirit or essential characteristics thereof. Accordingly, a disclosure of the preferred embodiment of the present invention is intended to be illustrative, but not limiting, to the scope of the invention which is set forth in the following claims.

I claim:

1. An improved method for forming a capacitor on an integrated circuit structure comprising:
    forming a first polycrystalline silicon layer;
    implanting n-conductivity type ions into the first polycrystalline silicon layer at an implant energy between approximately 80 and 100 keV;
    oxidizing the surface, of the polycrystalline silicon layer to form a uniform interpoly oxide layer, the oxidation being at a temperature which, for the implant dosage of the n-conductivity type ions, will make the interpoly oxide layer between approximately 770 and 2000 Angstroms thick;
    annealing the interpoly oxide layer in a gaseous mixture including HCl at a temperature of approximately 1100° C.; and
    forming a second polycrystalline silicon layer over said interpoly oxide layer.

2. The method of claim 1 wherein the first polycrystalline silicon layer is formed over an insulating layer.

3. The method of claim 1 wherein the n-conductivity ions comprise one of phosphorus or arsenic.

4. The method of claim 1 wherein the first polycrystalline silicon layer is formed at a temperature of approximately 600° C.

5. The method of claim 1 wherein the n-conductivity type ions comprise arsenic.

6. The method of claim 1 wherein the n-conductivity type ions comprise phosphorous.

7. The method of claim 2 wherein the insulating layer comprises a field isolation region of silicon dioxide approximately 1400 Angstroms thick.

8. An improved method for forming a capacitor on a silicon dioxide insulating layer on an integrated circuit structure, the method comprising:
    forming a first polycrystalline silicon layer at a temperature of approximately 600° C.;
    implanting n-conductivity type ions into the first polycrystalline silicon layer at an implant dosage of approximately $3 \times 10^{15}$ ions/cm$^2$ and an implant energy between approximately 80 and 100 keV;
    oxidizing the surface of the first polycrystalline silicon layer to form an interpoly oxide layer, the oxidizing step comprising:
        inserting the integrated circuit structure into a diffusion furnace containing $N_2$ and $O_2$ at standard pressure and a flow rate of approximately 300 cubic centimeters per minute at approximately 850° C.;
    increasing the temperature inside the diffusion furnace from approximately 850° C. to approximately 1000° C. at a rate of approximately 8° C. per minute;
    replacing the $N_2$ and $O_2$ with $O_2$ at standard pressure and a flow rate of approximately 3000 cubic centimeters per minute for approximately 20 minutes;
    replacing the $O_2$ with a mixture of approximately 3% HCl and 97% $O_2$ for approximately 21 minutes;
    replacing the $O_2$ and HCl with $N_2$ at standard pressure and a flow rate of approximately 5000 cubic centimeters per minute;
    increasing the temperature inside the diffusion furnace to approximately 1100° C. over approximately a 20 minute period;
    replacing the $N_2$ with a mixture of approximately 95.4% $N_2$, 3.4% $O_2$ and 1.2% HCl for approximately 60 minutes;
    replacing the mixture with $N_2$ at standard pressure and a flow rate of approximately 5000 cubic centimeters per minute;
    decreasing the temperature inside the diffusion furnace to approximately 850° C. over a period of approximately 60 minutes; and
    forming a second polycrystalline silicon layer over the interpoly oxide layer.

9. An improved method for forming a capacitor on an integrated circuit structure comprising:
    forming a first polycrystalline silicon layer;
    implanting n-conductivity type ions into the first polycrystalline silicon layer at an implant energy between approximately 80 and 100 keV;
    inserting the integrated circuit structure into a diffusion furnace containing $N_2$ and $O_2$ at standard pressure and a flow rate of approximately 300 cubic centimeters per minute at approximately 850° C.;
    increasing the temperature inside the diffusion furnace from approximately 850° C. to approximately 1000° C. at a rate of approximately 8° C. per minute;
    replacing the $N_2$ and $O_2$ with $O_2$ at standard pressure and a flow of approximately 3000 cubic centimeters per minute for approximately 20 minutes;
    replacing the $O_2$ with a mixture of approximately 3% HCl and 97% $O_2$ for approximately 21 minutes;
    replacing the $O_2$ and HCl with $N_2$ at standard pressure and a flow rate of approximately 5000 cubic centimeters per minute;
    increasing the temperature inside the diffusion furnace to approximately 1100° C. over approximately a 20 minute period;
    replacing the $N_2$ with a mixture of approximately 95.4% $N_2$, 3.4% $O_2$ and 1.2% HCl for approximately 60 minutes;
    replacing the mixture with $N_2$ at standard pressure and a flow rate of approximately 5000 cubic centimeters per minute;
    decreasing the temperature inside the diffusion furnace to approximately 850° C. over a period of approximately 60 minutes;
    removing the integrated circuit structure from the diffusion furnace; and
    forming a second polycrystalline silicon layer over said interpoly oxide layer.

* * * * *